United States Patent
Li et al.

(10) Patent No.: US 12,550,616 B2
(45) Date of Patent: Feb. 10, 2026

(54) PROCESS OF EPITAXIAL GROWN PZT FILM AND METHOD OF MAKING A PZT DEVICE

(71) Applicant: FUJIFILM DIMATIX, INC., Lebanon, NH (US)

(72) Inventors: Youming Li, San Jose, CA (US); Diane Liu, Los Gatos, CA (US); Darren Imai, Los Gatos, CA (US)

(73) Assignee: FUJIFILM DIMATIX, INC., Lebanon, NH (US)

( * ) Notice: Subject to any disclaimer, the term of this patent is extended or adjusted under 35 U.S.C. 154(b) by 352 days.

(21) Appl. No.: 17/890,057

(22) Filed: Aug. 17, 2022

(65) Prior Publication Data

US 2024/0065105 A1    Feb. 22, 2024

(51) Int. Cl.
| | |
|---|---|
| H10N 30/079 | (2023.01) |
| B41J 2/14 | (2006.01) |
| H10N 30/00 | (2023.01) |
| H10N 30/06 | (2023.01) |
| H10N 30/076 | (2023.01) |
| H10N 30/20 | (2023.01) |
| H10N 30/853 | (2023.01) |
| H10N 30/87 | (2023.01) |

(52) U.S. Cl.
CPC ........ *H10N 30/079* (2023.02); *B41J 2/14274* (2013.01); *H10N 30/06* (2023.02); *H10N 30/076* (2023.02); *H10N 30/2047* (2023.02); *H10N 30/708* (2024.05); *H10N 30/8554* (2023.02); *H10N 30/877* (2023.02)

(58) Field of Classification Search
CPC .................................................. C23C 14/00
See application file for complete search history.

(56) References Cited

U.S. PATENT DOCUMENTS

| | | | | |
|---|---|---|---|---|
| 6,097,133 | A * | 8/2000 | Shimada | H10N 30/078 310/330 |
| 6,326,216 | B1 * | 12/2001 | Kato | C23C 14/088 257/295 |
| 2011/0140238 | A1 * | 6/2011 | Natori | H10B 53/30 257/532 |
| 2015/0054387 | A1 * | 2/2015 | Li | H10N 30/50 310/365 |
| 2021/0143319 | A1 * | 5/2021 | Sangle | C23C 14/5806 |

* cited by examiner

*Primary Examiner* — Dah-Wei D. Yuan
*Assistant Examiner* — Kristen A Dagenais
(74) *Attorney, Agent, or Firm* — Womble Bond Dickinson (US) LLP (57) ABSTRACT

A piezoelectric film stack is created by forming a lower electrode stack on a structured substrate. A pyrochlore lead zirconium titanate (PZT) buffer substrate layer is then formed on the lower electrode stack. A rapid thermal anneal of the PZT buffer substrate layer is then performed. Epitaxial perovskite (100) PZT film on the PZT buffer substrate layer is grown. An upper electrode stack is formed on the perovskite (100) PZT film.

15 Claims, 5 Drawing Sheets

PROCESS OF EPITAXIAL GROWN PZT FILM AND METHOD OF MAKING A PZT DEVICE

TECHNICAL FIELD

Aspects of the present disclosure relate to methods for forming piezoelectric materials and incorporating them into microelectricalmechanical systems (MEMS).

BACKGROUND

Piezoelectric materials have found many applications in industrial and consumer products, and lead zirconium titanate (PZT) is an important material that possesses significant piezoelectric characteristics with its crystalline structures.

SUMMARY

Rapid thermal annealing of a pyrochlore (220) PZT buffer layer can convert the entire PZT buffer layer into a single crystalline perovskite PZT (100) seed layer, suitable for subsequent epitaxial growth of perovskite (100) for use as a piezoelectric film in MEMS.

DESCRIPTION OF DRAWINGS

The described embodiments and the advantages thereof may best be understood by reference to the following description taken in conjunction with the accompanying drawings. These drawings in no way limit any changes in form and detail that may be made to the described embodiments without departing from the spirit and scope of the described embodiments.

DETAILED DESCRIPTION

The present disclosure describes a process for forming an epitaxial grown piezoelectric film stack, including lower and upper electrodes on a structured base wafer, for use in piezoelectric-based MEMS devices. The process results in a perovskite (100) PZT buffer layer supporting homoepitaxial growth of perovskite (100) PZT film. The present disclosure further describes constructing a radio frequency (RF) magnetron reactively sputtered homoepitaxial grown piezoelectric PZT thin film for use in fluid dispensing devices, e.g., MEMS piezoelectric PZT ink jet print heads, and in MEMS piezoelectric PZT ultrasonic and acoustic transducers.

Applying a voltage across a piezoelectric material can cause converse piezoelectricity, in which the piezoelectric material mechanically deforms. Alternatively, piezoelectric materials can generate a voltage differential when subjected to mechanical stress. Piezoelectricity can be harnessed for use in electrical and mechanical devices, such as ink jet print head and transducers, e.g., actuators and sensors. In some cases, multiple transducers, including a combination of actuators and sensors, can be combined in a MEMS.

Piezoelectric materials for either fluid dispensing devices or actuators can be obtained using a variety of methods, including Sol-gel, ceramic green sheets, metal-organic chemical vapor deposition (MOCVD) formed layers, or pre-fired blocks of piezoelectric material. However, these different methods can form piezoelectric materials of varying quality and composition. For example, a Sol-gel formation technique may require multiple iterations to produce many individual thin layers to form a thick piezoelectric material. Also, Sol-gel formation can leave bonding agents in the final material. MOCVD can construct thin layers of piezoelectric material and can have very low deposition rates.

PZT films can have a perovskite crystalline structure following the formula $ABX_3$ and can include materials with different orientations of crystalline phases, e.g., perovskite (100), perovskite (110), and perovskite (111), as well as non-functional pyrochlore (220), due to film substrate properties and the technological limitations of the film growth hardware technologies. The piezoelectric effects of the resulting films can depend on the quality of the PZT film crystallinity as well as the quality of the PZT material in an interface transition region at a substrate-to-PZT film interface. Note that when forming a perovskite piezoelectric PZT film on a substrate, the substrate's physical properties, including its crystal structures, can play an important role in determine the quality of the growing PZT. For example, an embodiment of a uni-morph piezoelectric device could have a PZT film comprised of the highest crystalline phase of perovskite (100) and minimize or eliminate the non-functional pyrochlore (220) phase (and preferably, a monocrystalline PZT (100)), to maximize a transverse electro-mechanical response.

Perovskite PZT film can be grown on some selected metal seed layers, e.g., iridium, platinum, etc., of substrates. However, due to the dissimilarity of their physical properties—in particular a lattice mismatch between the seed metals and PZT—the resulting PZT film can be polycrystalline in nature and can contain an inferior transition region at the seed metal-to-PZT interface. Certain doped metal oxide seed layers have been adopted to serve as substrates to grow good quality perovskite PZT films, and $SrRuO_3$, for example, can be used to grow high crystallinity PZT films for various application. However, while these doped metal oxide seeds provide an improved lattice match to PZT that can lead to a pseudomorphic growth of perovskite PZT materials, they are still an imperfect match such that an interface strain and defects still exist in the interfacial region at the substrate-to-PZT interface. Thus, a need exists to provide a process for producing a PZT film that is predominantly perovskite (100) PZT though the PZT film stack, without other PZT unwanted crystalline phases, that supports an epitaxial PZT growth process that can produce a nearly monocrystalline perovskite PZT (100). Such a PZT film can maximize its piezoelectric effects. In some embodiments, "predominantly" refers to the PZT buffer layer being converted such that, in reference to the x-ray diffraction (XRD) spectrum, the peak height of perovskite PZT (100) is at least twice the peak height of any residual pyrochlore PZT (220).

In some embodiments, the process involves a rotating RF magnetron physical vapor deposition (PVD) apparatus with a self-biased substrate RF impedance matching network for control of the substrate DC self-bias voltage. A suitable PVD apparatus is described in Physical Vapor Deposition with Impedance Matching Network, U.S. application Ser. No. 12/389,253, filed Feb. 19, 2009, which is incorporated herein by reference. In some cases, a reactive PVD process uses argon and oxygen (Ar/O$_2$) as sputtering process gases.

In some embodiments, a ceramic PZT target can be used, having a composition of $Pb_{1.00+x}(Zr_{0.52}Ti_{0.48})_{1.00-y}O_3Nb_y$, where 0<=x<=0.30 and 0<=y<=0.20. In some embodiments, 0<=x<=0.05 and 0<=y<=0.10.

In some embodiments, the epitaxial PZT film growth process commences by sputter depositing a pyrochlore PZT film, as a PZT buffer layer, on a substrate with a lower electrode stack comprising an appropriate seed metal layer. In some cases, the seed metal can be platinum or iridium, of a thickness of 500 Å to 5000 Å. In some cases, the seed metal can be iridium, of a thickness of 1000 to 2500 Angstroms (Å). In some cases, the seed metal can be deposited by reactive sputtering deposition. In some embodiments, in which the seed metal is iridium, the iridium can have a (111) crystal plane. In some embodiments, the lower electrode stack can also include an adhesion layer. In some cases, the adhesion layer can be one of titanium, titanium tungsten, chromium, nickel, or molybdenum, of a thickness of 100 Å to 500 Å. In some cases, the adhesion layer can be deposited by PVD.

In some cases, the PZT film comprises a buffer layer of pyrochlore (220) PZT, which does not possess piezoelectric qualities. This PZT buffer layer can be grown by means of reactive sputtering deposition of PZT film at a deposition temperature between 400° C. and 500° C. In some embodiments, the deposition can have a thickness of 500 Å to 3000 Å. In a preferred embodiment, the deposition is 1500 Å to 2000 Å. A rapid thermal annealing process can convert this pyrochlore PZT into a perovskite PZT (100) seed layer onto which a homoepitaxial thick perovskite (100) PZT can be grown.

In some cases, the reactive sputtering deposition of the piezoelectric PZT is performed at a wafer chuck temperature between 400° C. and 750° C. In some cases, the gas (Ar/O$_2$) pressure can be between 1 and 15 mTorr. In some preferred embodiments, the gas pressure is between 2 and 6 mTorr. In some embodiments, the gas ratio of O$_2$/(Ar+O$_2$) is between 1.0 and 5.0%. In some preferred embodiments, the gas ratio is 2.5 to 3.5%. In some embodiments, the cathode RF power is between 1000 W and 5000 W, and preferably 4000 W. In some cases, the substrate DC self-bias is between +5 and +150V, and preferably between +20V and +80V.

Next, in some embodiments, a rapid thermal annealing process is performed on the substrate on which the pyrochlore PZT buffer layer has been deposited. In some cases, this rapid thermal annealing process can be carried out in an oven, a furnace, a rapid thermal annealer, or a hot plate, in air, vacuum, or a partial oxygen atmosphere. In some cases, the rapid thermal annealing process subjects the substrate to a temperature of 550° C. to 700° C. for 1 to 6 minutes. In some preferred embodiments, the thermal annealing process subjects the substrate to a temperature of 600° C. to 650° C., for 2 to 4 minutes. In some embodiments, the rapid thermal annealing process converts the pyrochlore PZT buffer layer into a predominantly perovskite PZT (100) crystalline phase thus producing a perovskite PZT (100) crystalline seed layer for subsequent epitaxial growth of a monophase perovskite PZT film of (100) crystal structure.

Then, by selecting an PZT film growth condition and using reactive sputtering deposition of piezoelectric PZT, in some embodiments, an epitaxial growth of 0.5 to 5 microns of perovskite (100) film can be produced at a deposition temperature of 500° C. to 650° C. Since this growth of the preferred PZT (100) film is initiated on a substrate that already possesses a PZT (100) seed layer, a homoepitaxial growth of a preferred PZT film can be realized.

In some embodiments, the resulting piezoelectric PZT film can have a composition of $Pb_{1.00+x}(Zr_{0.50+/-0.02}Ti_{0.50-/+0.02})_{1.00-y}O_3Nb_y$, where -0.01<=x<=0.10 and 0<=y<=0.15. In some embodiments, 0<=x<=0.05 and 0<=y<=0.10. In some embodiments, the resulting PZT is perovskite PZT, and particularly, perovskite PZT (100), and/or perovskite PZT (111), and more preferably a monocrystalline perovskite PZT (100) that includes the PZT buffer layer in its entirety.

In some embodiments, an upper electrode stack can then be deposited. The upper electrode stack can include an upper electrode, comprising a conductive metal such as platinum, iridium, gold, copper, aluminum, indium-tin-oxide, etc., of a thickness of 1000 Å to 2 microns. In some cases, the upper electrode can be deposited by PVD. In some embodiments, the upper electrode stack can also include an adhesion layer. In some cases, the adhesion layer can be one of titanium, titanium tungsten, chromium, nickel, nickel chromium, etc., of a thickness of 100 Å to 1000 Å. In some cases, the adhesion layer can be a metal oxide that is also electrically conductive, e.g., indium tin oxide, zinc oxide, etc. In some cases, the adhesion layer can be deposited by PVD.

Figure 1:
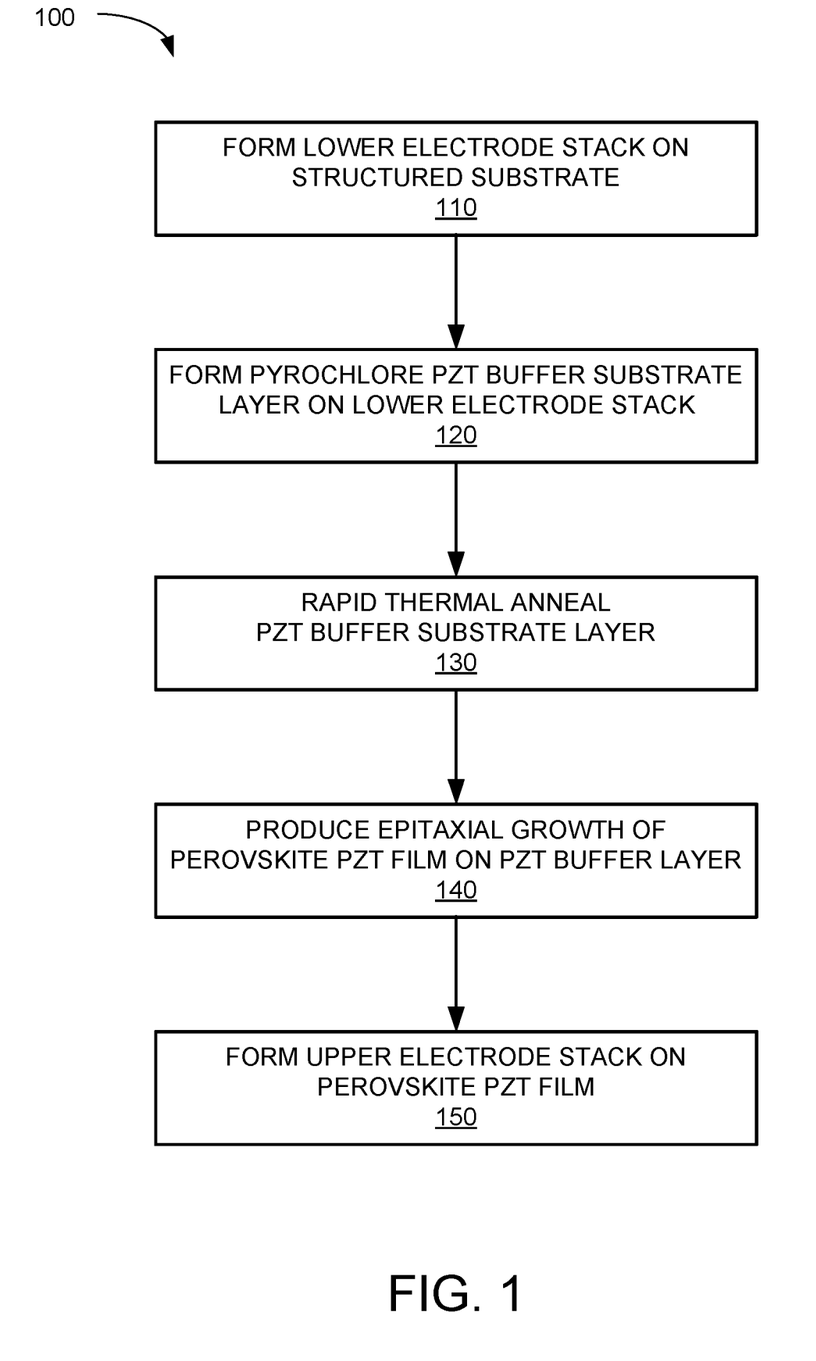
FIG. 1 is an illustration of an example process flow for making epitaxial PZT film in accordance with embodiments of the disclosure.

FIG. 1 depicts an example process flow for making epitaxial PZT film in accordance with embodiments of the disclosure. As shown in FIG. 1, method 100 illustrates example functions used by various embodiments. Although specific function blocks ("blocks") are disclosed in method 100, such blocks are examples. That is, examples are well suited to performing various other blocks or variations of the blocks recited in method 100. It is appreciated that the blocks in method 100 may be performed in an order different than presented, and that some of the blocks in method 100 may not be performed.

Method 100 begins at block 110, where a lower electrode stack is formed on a structured substrate. The lower electrode stack can include a seed metal layer and can also include an adhesion layer. The seed metal layer can be platinum or iridium. Other metals are contemplated. An adhesion layer can also be deposited, to reduce a likelihood of delamination of a subsequently deposited buffer PZT layer. The adhesion layer can be titanium, titanium tungsten, chromium, nickel, or molybdenum. Other materials are contemplated for the adhesion layer. Both the seed metal layer and adhesion layer can be deposited by PVD.

At block 120, a pyrochlore (220) PZT buffer substrate layer is deposited on the lower electrode stack. The buffer substrate layer can be deposited by reactive sputtering deposition. In the example, the buffer substrate layer of pyrochlore (220) can be transformed into a homogenous crystalline perovskite (100) PZT.

At block 130, the pyrochlore (220) PZT buffer substrate layer undergoes rapid thermal annealing. In the example, the thermal annealing process subjects the substrate to a temperature of 600° C. to 650° C., for 2 to 4 minutes. In the example, the rapid thermal annealing substantially converts the pyrochlore (220) PZT buffer layer into perovskite (100) PZT.

At block 140, epitaxial growth of perovskite (100) PZT film is formed on the PZT buffer substrate layer with reactive sputtering deposition. In the example, an epitaxial growth of 0.5 to 5 microns of perovskite (100) film can be produced at a deposition temperature between 500° C. and 650° C.

At block 150, an upper electrode stack is formed on the perovskite (100) PZT film. The upper electrode stack can include an upper electrode, comprising a conductive metal such as platinum, iridium, gold, copper, aluminum, indium-tin-oxide, etc. In the example, the upper electrode can be deposited by PVD. In the example, the upper electrode stack can include an adhesion layer. The adhesion layer can be one of titanium, titanium tungsten, chromium, nickel, nickel chromium, etc. In the example, the adhesion layer can be deposited by PVD.

Figure 2:
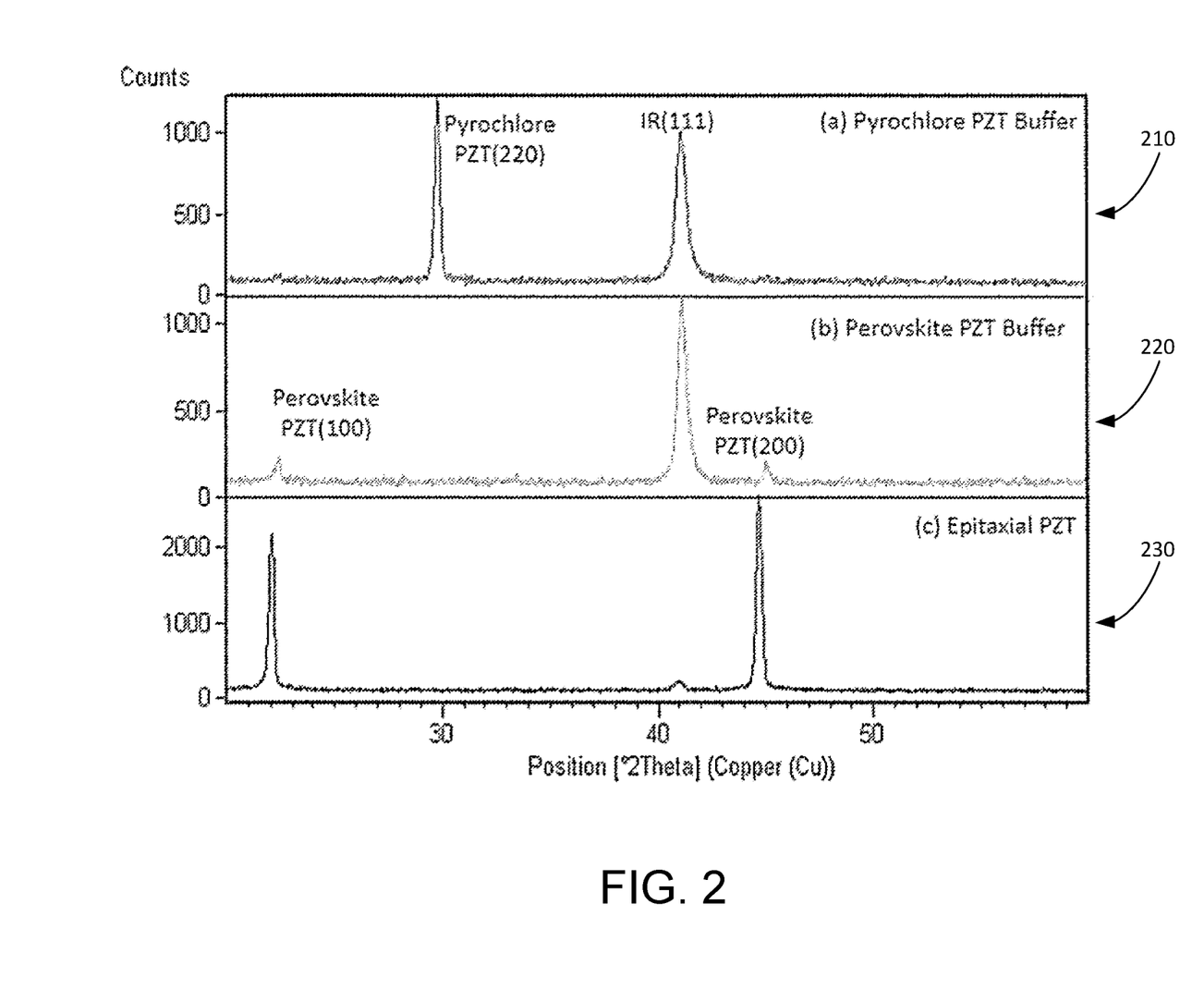
FIG. 2 is an illustration of an X-ray diffraction pattern of an example piezoelectric PZT layer, in accordance with embodiments of the disclosure.

FIG. 2 depicts an illustration of XRD patterns of example piezoelectric PZT layers, in accordance with embodiments of the disclosure.

XRD pattern 210 shows an example of a ceramic target with an iridium lower electrode stack on which pyrochlore (220) has been deposited. The XRD pattern 210 shows the (111) crystal orientation of the seed metal iridium (IR). X-ray diffraction pattern 210 also shows the pyrochlore, with a crystal orientation of (220), prior to rapid thermal annealing.

XRD pattern 220 shows an example of a result of rapid thermal annealing. XRD pattern 220 indicates the transformation of the bulk of the pyrochlore (220) to perovskite (100) and a small amount of perovskite (200).

XRD pattern 230 shows an example of epitaxial growth of 1.5 microns of perovskite (100) PZT on the rapid thermal annealed substrate. The increased height of the perovskite (100) peak (and reduced iridium (111) height) is indicative of the thicker film. The increased perovskite (200) peak height, the $2n$ d order diffraction peak of the (100) plane, is further indication that the film is comprised predominantly of perovskite (100).

Figure 3:
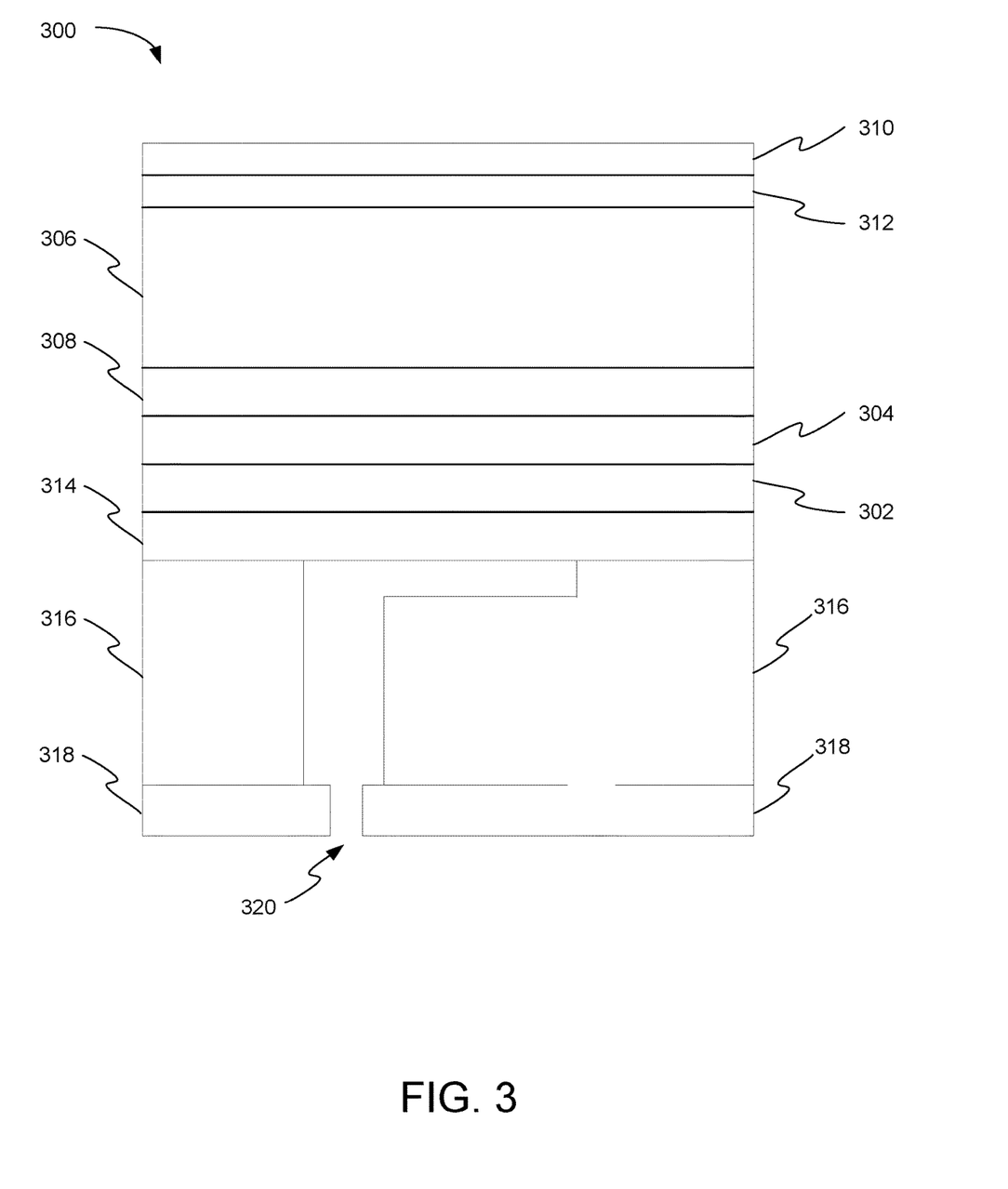
FIG. 3 is a cross-sectional view of an example of a MEMS piezoelectric PZT ink jet print head, in accordance with some embodiments of the disclosure.
Figure 4:
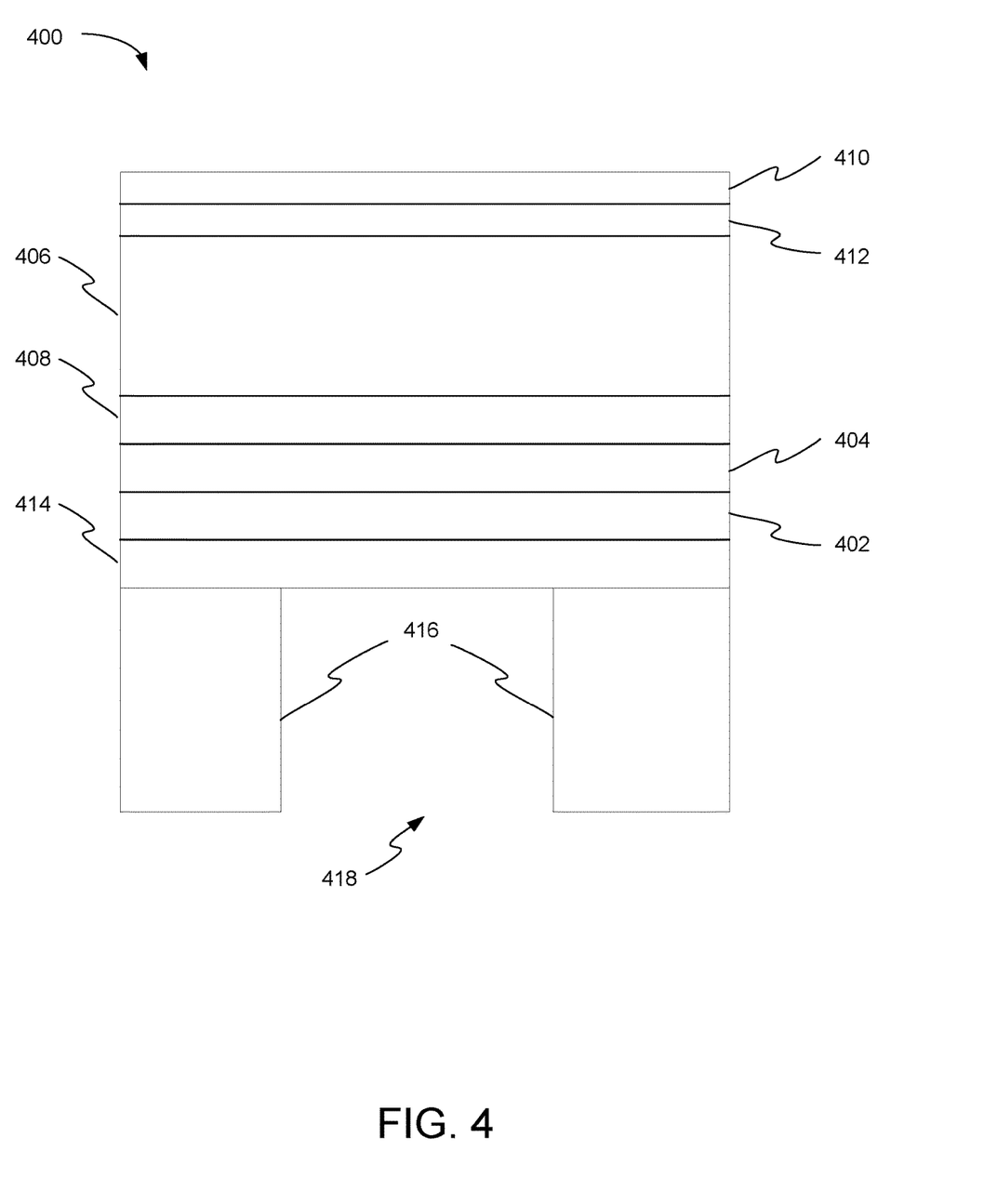
FIG. 4 is a cross-sectional view of an example of a MEMS piezoelectric ultrasonic transducer, in accordance with some embodiments of the disclosure.
Figure 5:
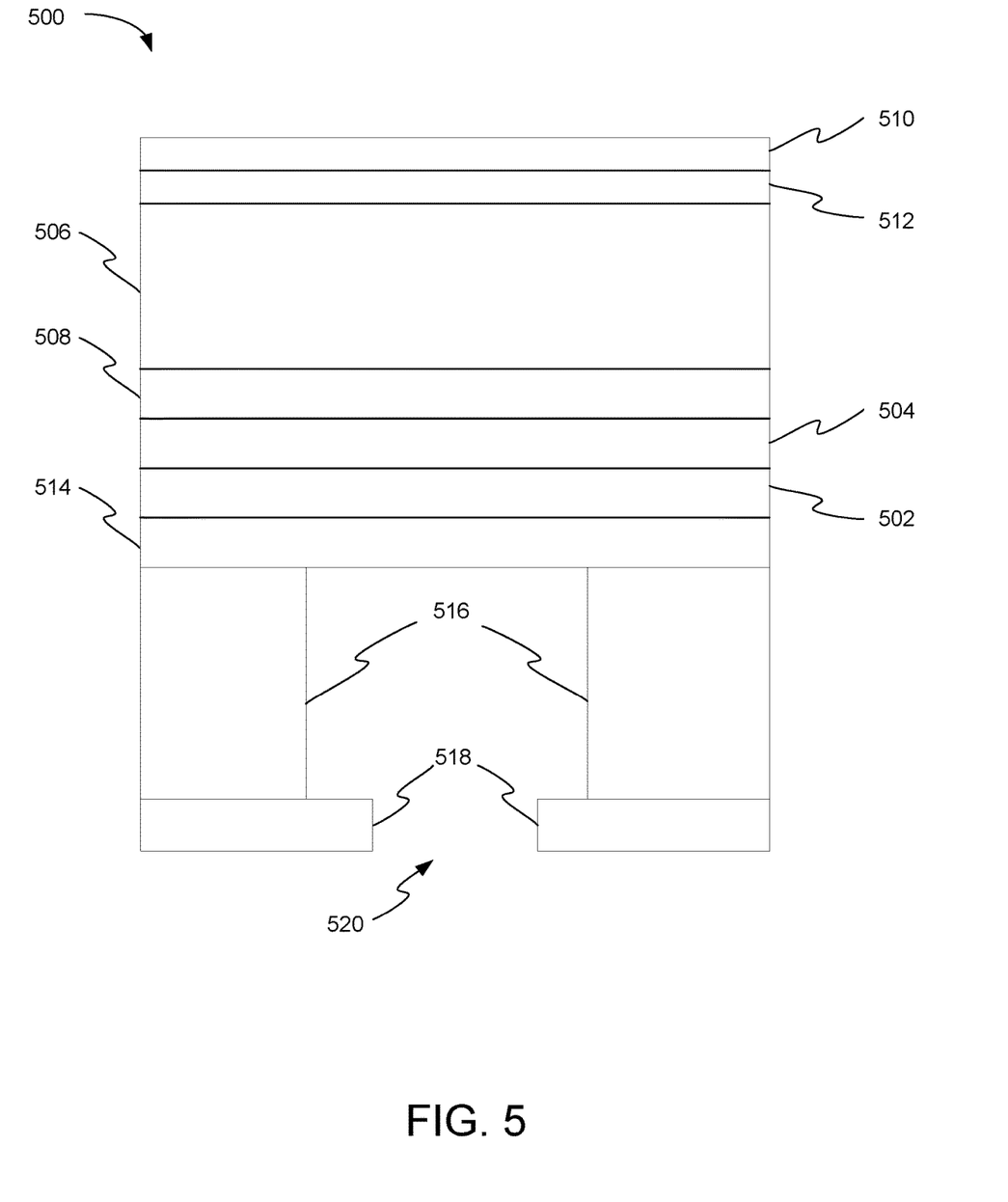
FIG. 5 is a cross-sectional view of an example of a MEMS piezoelectric PZT acoustic transducer, in accordance with some embodiments of the disclosure.

FIGS. 3-5 show cross-sectional views of examples of MEMS devices comprising piezoelectric PZT films produced as described in FIG. 1. The examples show piezoelectric film stacks, as described above, on top of a deflection membrane and a MEMS body.

FIG. 3 illustrates a cross-sectional view of an example of a MEMS piezoelectric PZT ink jet print head 300, comprising a piezoelectric PZT film stack in accordance with some embodiments of the disclosure.

The example MEMS piezoelectric PZT ink jet print head 300 illustrates a lower electrode 304, and an adhesion layer 302. The combination of the lower electrode 304 and the adhesion layer 302 comprises a lower electrode stack. In the example, the lower electrode 302 is iridium. In another example, the lower electrode is platinum.

The example MEMS piezoelectric PZT ink jet print head 300 further comprises a buffer PZT layer 308. In the example 300, the buffer PZT layer 308 is deposited using PVD on the lower electrode stack. The deposited material is pyrochlore (220) PZT, which is non-functional as a piezoelectric material. After being subjected to rapid thermal annealing, the buffer PZT layer 308 will be largely converted to perovskite (100) PZT.

After converting the buffer PZT layer 308 to perovskite (100), an epitaxial PZT film growth process is applied to the buffer PZT layer 308, to produce an epitaxial growth layer 306. The epitaxial growth layer 306 comprises perovskite (100).

The example MEMS piezoelectric PZT ink jet print head 300 further comprises an upper electrode 310, and an adhesion layer 312. The combination of the upper electrode 310 and the adhesion layer 312 comprises an upper electrode stack. In the example, the upper electrode 310 is iridium. In another example, the upper electrode is platinum. In another example, the upper electrode is indium-tin-oxide.

The example MEMS piezoelectric PZT ink jet print head 300 further comprises a deflection membrane 314. As a result of voltage applied across the upper and lower electrode stacks, the deflection membrane 314 will bend, creating a pumping action and forcing a fluid, e.g., ink, out of the body 316 and through a nozzle plate 318 with an ink jetting nozzle 320. In the example MEMS piezoelectric PZT ink jet print head 300, the body 316 comprises a base wafer with an ink channel and pumping chamber.

FIG. 4 illustrates a cross-sectional view of an example of a MEMS piezoelectric ultrasonic transducer 400, in accordance with some embodiments of the disclosure.

The example MEMS piezoelectric ultrasonic transducer 400 illustrates a lower electrode 404, and an adhesion layer 402. The combination of the lower electrode 404 and the adhesion layer 402 comprises a lower electrode stack. In the example, the lower electrode 404 is iridium. In another example, the lower electrode is platinum.

The example MEMS piezoelectric ultrasonic transducer 400 further comprises a buffer PZT layer 408. In the example 400, the buffer PZT layer 408 is deposited using PVD on the lower electrode stack. The deposited material is pyrochlore (220) PZT, which is non-functional as a piezoelectric material. After being subjected to rapid thermal annealing, the buffer PZT layer 408 will be largely converted to perovskite (100) PZT.

After converting the buffer PZT layer 408 to perovskite (100), an epitaxial PZT film growth process is applied to the buffer PZT layer 408, to produce an epitaxial growth layer 406. The epitaxial growth layer 406 comprises perovskite (100).

The example MEMS piezoelectric ultrasonic transducer 400 further comprises an upper electrode 410, and an adhesion layer 412. The combination of the upper electrode 410 and the adhesion layer 412 comprises an upper electrode stack. In the example, the upper electrode 410 is iridium. In another example, the upper electrode is platinum. In another example, the upper electrode is indium-tin-oxide.

The example MEMS piezoelectric ultrasonic transducer 400 further comprises a deflection membrane 414. As a result of voltage applied across the upper and lower electrode stacks, the deflection membrane 414 will bend, creating ultrasonic waves that exit through an aperture 418 in a body 416. Furthermore, returning ultrasonic waves will cause the deflection membrane to bend, generating a voltage between the upper and lower electrode stacks. In the example MEMS piezoelectric ultrasonic transducer 400, the body 416 comprises a base wafer with a backside air gap.

FIG. 5 is a cross-sectional view of an example of a MEMS piezoelectric PZT acoustic transducer, in accordance with some embodiments of the disclosure.

The example MEMS piezoelectric acoustic transducer 500 illustrates a lower electrode 504, and an adhesion layer 502. The combination of the lower electrode 504 and the adhesion layer 502 comprises a lower electrode stack. In the example, the lower electrode 504 is iridium. In another example, the lower electrode is platinum.

The example MEMS piezoelectric acoustic transducer 500 further comprises a buffer PZT layer 508. In the example 500, the buffer PZT layer 508 is deposited using PVD on the lower electrode stack. The deposited material is pyrochlore (220) PZT, which is non-functional as a piezoelectric material. After being subjected to rapid thermal annealing, the buffer PZT layer 508 will be largely converted to perovskite (100) PZT.

After converting the buffer PZT layer 508 to perovskite (100), an epitaxial PZT film growth process is applied to the buffer PZT layer 508, to produce an epitaxial growth layer 506. The epitaxial growth layer 506 comprises perovskite (100).

The example MEMS piezoelectric acoustic transducer 500 further comprises an upper electrode 510, and an adhesion layer 512. The combination of the upper electrode 510 and the adhesion layer 512 comprises an upper electrode stack. In the example, the upper electrode 510 is iridium. In another example, the upper electrode is platinum. In another example, the upper electrode is indium-tin-oxide.

The example MEMS piezoelectric acoustic transducer 500 further comprises a deflection membrane 514. As a result of voltage applied across the upper and lower electrode stacks, the deflection membrane 514 will bend, creating acoustic waves that exit through a back plate 518 with a sound hole 520 in a body 516. Furthermore, returning acoustic waves will cause the deflection membrane to bend, generating a voltage between the upper and lower electrode stacks. In the example MEMS piezoelectric acoustic transducer 500, the body 516 comprises a base wafer with a backside air gap cavity.

Various general-purpose systems may be used in accordance with the teachings described herein, or it may prove convenient to construct more specialized apparatus to perform the required method steps. The required structure for a variety of these systems will appear as set forth in the description above.

The above description is intended to be illustrative, and not restrictive. Although the present disclosure has been described with references to specific illustrative examples, it will be recognized that the present disclosure is not limited to the examples described. The scope of the disclosure should be determined with reference to the following claims, along with the full scope of equivalents to which the claims are entitled.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although the method operations were described in a specific order, other operations may be performed in between described operations, described operations may be adjusted so that they occur at slightly different times, or the described operations may be distributed in a system which allows the occurrence of the processing operations at various intervals associated with the processing.

Various units, circuits, or other components may be described or claimed as "configured to" or "configurable to" perform a task or tasks. In such contexts, the phrase "configured to" or "configurable to" is used to connote structure by indicating that the units/circuits/components include structure (e.g., circuitry) that performs the task or tasks during operation. As such, the unit/circuit/component can be said to be configured to perform the task, or configurable to perform the task, even when the specified unit/circuit/component is not currently operational (e.g., is not on). The units/circuits/components used with the "configured to" or "configurable to" language include hardware—for example, circuits, memory storing program instructions executable to implement the operation, etc. Reciting that a unit/circuit/component is "configured to" perform one or more tasks, or is "configurable to" perform one or more tasks, is expressly intended to not invoke 35 U.S.C. 112, sixth paragraph, for that unit/circuit/component. Additionally, "configured to" or "configurable to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks. "Configurable to" is expressly intended not to apply to blank media, an unprogrammed processor or unprogrammed generic computer, or an unprogrammed programmable logic device, programmable gate array, or other unprogrammed device, unless accompanied by programmed media that confers the ability to the unprogrammed device to be configured to perform the disclosed function(s).

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein but may be modified within the scope and equivalents of the appended claims.

What is claimed is:

1. A method for creating a piezoelectric stack, the method comprising:
    forming a lower electrode stack on a structured substrate;
    forming a pyrochlore lead zirconium titanate (PZT) (220) buffer substrate layer on the lower electrode stack, wherein the pyrochlore (220) PZT is non-functional as a piezoelectric material;
    creating a perovskite PZT (100) crystalline seed layer for subsequent epitaxial growth by performing a rapid thermal anneal of the PZT buffer substrate layer, wherein the buffer substrate layer is converted such that a peak height of perovskite PZT (100) is at least twice a peak height of any residual pyrochlore PZT (220) in reference to an x-ray diffraction spectrum;
    performing epitaxial growth of perovskite (100) PZT on the PZT buffer substrate layer after the rapid thermal anneal of the PZT buffer substrate layer;
    forming an upper electrode stack on the perovskite (100) PZT; and coupling a deflection membrane to the lower electrode stack.

2. The method of claim 1, wherein forming the lower electrode stack comprises depositing a metal seed layer of iridium or platinum.

3. The method of claim 1, wherein the rapid thermal anneal of the PZT buffer substrate is performed at a temperature between 600° C. and 650° C.

4. The method of claim 1, wherein the rapid thermal anneal of the PZT buffer substrate is performed for a period of between two and four minutes.

5. The method of claim 1, wherein performing the rapid thermal anneal of the PZT buffer substrate transforms the PZT buffer substrate layer to perovskite (100) PZT.

6. The method of claim 1, wherein performing the epitaxial growth of perovskite (100) PZT occurs at a temperature between 500° C. and 650° C.

7. The method of claim 1, wherein forming the lower electrode stack comprises depositing an adhesion layer including titanium, titanium tungsten, chromium, nickel, or molybdenum.

8. The method of claim 1, wherein forming the pyrochlore lead zirconium titanate (PZT) buffer substrate layer on the lower electrode stack is performed by RF magnetron sputtering.

9. The method of claim 1 wherein the rapid thermal annealing process converts the buffer substrate layer into homogeneous crystalline perovskite PZT (100) layer onto which a homoepitaxial perovskite PZT (100) can be grown.

10. The method of claim 1 wherein the buffer substrate layer comprises pyrochlore (220) and the rapid thermal annealing process converts the buffer substrate layer of pyrochlore (220) into the perovskite PZT (100) crystalline seed layer.

11. A method for creating a piezoelectric stack, the method comprising:
    forming a lower electrode stack on a structured substrate;
    forming a pyrochlore lead zirconium titanate (PZT) (220) buffer substrate layer on the lower electrode stack, wherein the pyrochlore (220) PZT is non-functional as a piezoelectric material;
    creating a perovskite PZT (100) crystalline seed layer for subsequent epitaxial growth by performing a rapid thermal anneal of the PZT buffer substrate layer of pyrochlore (220) at a temperature between 600° C. and 650° C., wherein the buffer substrate layer is converted such that a peak height of perovskite PZT (100) is at least twice a peak height of any residual pyrochlore PZT (220) in reference to an x-ray diffraction spectrum;
    performing epitaxial growth of perovskite (100) PZT on the PZT buffer substrate layer occurs at a temperature between 500° C. and 650° C. after the rapid thermal anneal of the PZT buffer substrate layer of pyrochlore (220);
    forming an upper electrode stack on the perovskite (100) PZT; and
    coupling a deflection membrane to the lower electrode stack.

12. The method of claim 11, wherein forming the lower electrode stack comprises depositing a metal seed layer of iridium or platinum.

13. The method of claim 11, wherein the rapid thermal anneal of the PZT buffer substrate is performed for a period of between two and four minutes.

14. The method of claim 11, wherein forming the lower electrode stack comprises depositing an adhesion layer including titanium, titanium tungsten, chromium, nickel, or molybdenum.

15. The method of claim 11, wherein forming the pyrochlore lead zirconium titanate (PZT) buffer substrate layer on the lower electrode stack is performed by RF magnetron sputtering.

* * * * *